(12) United States Patent
Su et al.

(10) Patent No.: US 12,469,697 B2
(45) Date of Patent: Nov. 11, 2025

(54) PREPARATION METHOD FOR CAPACITOR STRUCTURE, CAPACITOR STRUCTURE, AND MEMORY

(71) Applicant: CHANGXIN MEMORY TECHNOLOGIES, INC., Hefei (CN)

(72) Inventors: Xingsong Su, Hefei (CN); Weiping Bai, Hefei (CN); Mengkang Yu, Hefei (CN); Lianhong Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 995 days.

(21) Appl. No.: 17/444,690

(22) Filed: Aug. 9, 2021

(65) Prior Publication Data
US 2022/0230876 A1 Jul. 21, 2022

Related U.S. Application Data

(63) Continuation of application No. PCT/CN2021/098877, filed on Jun. 8, 2021.

(30) Foreign Application Priority Data

Jan. 20, 2021 (CN) .......................... 202110075635.8

(51) Int. Cl.
H01L 21/02 (2006.01)
H10B 12/00 (2023.01)
(Continued)

(52) U.S. Cl.
CPC .. *H01L 21/02356* (2013.01); *H01L 21/02148* (2013.01); *H01L 21/02159* (2013.01);
(Continued)

(58) Field of Classification Search
CPC ......... H01L 21/02356; H01L 21/02148; H01L 21/02159; H10D 1/716; H10D 1/042;
(Continued)

(56) References Cited

U.S. PATENT DOCUMENTS 7,371,633 B2 5/2008 Lee
7,616,426 B2 11/2009 Kil
(Continued)

FOREIGN PATENT DOCUMENTS

CN 1655362 A 8/2005
CN 1934685 A 3/2007
(Continued)

OTHER PUBLICATIONS

Supplementary European Search Report in the European Application No. 21783125.4, mailed on Jun. 3, 2022.

*Primary Examiner* — Brigitte A Paterson
(74) *Attorney, Agent, or Firm* — Syncoda LLC; Feng Ma

(57) ABSTRACT

A preparation method for the capacitor structure includes: forming a dielectric layer on a first electrode, wherein, the dielectric layer includes a first amorphous layer and a high dielectric constant layer which are stacked, the first amorphous layer maintaining an amorphous structure after annealing, and the high dielectric constant layer being formed by crystallizing an initial dielectric constant layer after annealing; and forming a second electrode on the dielectric layer. Since the first amorphous layer remains an amorphous structure after annealing, electron transport can be suppressed, thereby reducing the leakage current of the capacitor structure.

17 Claims, 13 Drawing Sheets

(51) Int. Cl.
  *H10D 1/00* (2025.01)
  *H10D 1/68* (2025.01)

(52) U.S. Cl.
  CPC ....... *H01L 21/02194* (2013.01); *H10B 12/03* (2023.02); *H10B 12/30* (2023.02); *H10D 1/042* (2025.01); *H10D 1/68* (2025.01); *H10D 1/716* (2025.01); *H10D 1/684* (2025.01)

(58) Field of Classification Search
  CPC .......... H10D 1/68; H10D 1/684; H10B 12/03; H10B 12/30
  See application file for complete search history.

(56) References Cited

U.S. PATENT DOCUMENTS

| | | | |
|---|---|---|---|
| 7,763,953 B2 | 7/2010 | Tanioku | |
| 7,820,506 B2 | 10/2010 | Rocklein | |
| 7,835,134 B2 | 11/2010 | Kil | |
| 8,187,933 B2 | 5/2012 | Rocklein | |
| 8,323,754 B2 | 12/2012 | Olsen | |
| 8,603,877 B2 | 12/2013 | Rocklein | |
| 2005/0151184 A1 | 7/2005 | Lee | |
| 2005/0260357 A1 | 11/2005 | Olsen | |
| 2005/0282400 A1* | 12/2005 | Xiao | H10D 64/691 |
| | | | 257/E21.267 |
| 2007/0048953 A1* | 3/2007 | Gealy | H01L 21/31645 |
| | | | 438/305 |
| 2007/0102742 A1 | 5/2007 | Kil | |
| 2008/0224263 A1 | 9/2008 | Tanioku | |
| 2010/0014212 A1 | 1/2010 | Kil | |
| 2010/0090309 A1 | 4/2010 | Rocklein | |
| 2011/0020999 A1 | 1/2011 | Rocklein | |
| 2012/0202358 A1 | 8/2012 | Gealy | |
| 2012/0220098 A1 | 8/2012 | Rocklein | |
| 2015/0137254 A1 | 5/2015 | Gealy et al. | |

FOREIGN PATENT DOCUMENTS

| | | |
|---|---|---|
| CN | 100405576 C | 7/2008 |
| CN | 102187440 A | 9/2011 |
| CN | 101276690 B | 1/2012 |

* cited by examiner

PREPARATION METHOD FOR CAPACITOR STRUCTURE, CAPACITOR STRUCTURE, AND MEMORY

CROSS-REFERENCE TO RELATED APPLICATIONS

This is a continuation of International Patent Application No. PCT/CN2021/098877 filed on Jun. 8, 2021, which claims priority to Chinese Patent Application No. 202110075635.8 filed on Jan. 20, 2021. The disclosures of these applications are hereby incorporated by reference in their entirety.

BACKGROUND

A Dynamic Random-Access Memory (DRAM) is widely used in various electronic devices because of its high density and high read-write speed. The DRAM is generally composed of a plurality of storage units, each usually including a transistor and a capacitor structure. Data information is stored in the capacitor structure, and the transistor controls the reading and writing of the data information in the capacitor structure.

SUMMARY

The present application relates generally to the technical field of semiconductor processes, and more specifically to a preparation method for a capacitor structure, a capacitor structure, and a memory.

Various embodiments of the present application provide a preparation method for a capacitor structure, a capacitor structure, and a memory, which are intended to solve the technical problem of large leakage current of the capacitor structure.

According to a first aspect, the present application provides a preparation method for a capacitor structure. The preparation method include: forming a dielectric layer on a first electrode; wherein, the dielectric layer including a first amorphous layer and a high dielectric constant layer arranged in a stack, the first amorphous layer maintaining an amorphous structure after annealing, and the high dielectric constant layer being formed by crystallizing an initial dielectric constant layer after annealing; and forming a second electrode on the dielectric layer.

The preparation method for the capacitor structure provided by the present application has the following advantages:

In the preparation method for the capacitor structure provided by the present application, a dielectric layer is first formed on a first electrode. The dielectric layer includes a first amorphous layer and a high dielectric constant layer which are stacked. The first amorphous layer maintains an amorphous structure after annealing. The high dielectric constant layer is formed by crystallizing an initial dielectric constant layer after annealing. A second electrode is then formed on the dielectric layer. Since the first amorphous layer maintains an amorphous structure after annealing, electron migration is unlikely to occur in an amorphous structure, therefore the first amorphous layer can inhibit electron transport, the leakage current of the capacitor structure is reduced, and the performance of the capacitor structure is improved.

In the above-described preparation method for the capacitor structure, the step of forming a dielectric layer on a first electrode include: forming a first amorphous layer on the first electrode; forming an initial dielectric constant layer on the first amorphous layer; annealing the first amorphous layer and the initial dielectric constant layer, wherein, the first amorphous layer maintaining an amorphous structure after annealing, and the initial dielectric constant layer forming a high dielectric constant layer after annealing; and forming a second amorphous layer on the high dielectric constant layer.

In the above-described preparation method for the capacitor structure, the material of the second amorphous layer may include silicon oxide, aluminum oxide, hafnium silicate with a mass concentration of silicon of 10%-50%, or aluminum titanate with a mass concentration of aluminum of 10%-50%, and the second amorphous layer has a thickness of 0.5 nm-5 nm.

In the above-described preparation method for the capacitor structure, the step of forming a dielectric layer on a first electrode include: forming a first amorphous layer on the first electrode; forming an initial dielectric constant layer on the first amorphous layer; forming a second amorphous layer on the initial dielectric constant layer; and annealing the first amorphous layer, the initial dielectric constant layer, and the second amorphous layer. Both the first amorphous layer and the second amorphous layer maintain an amorphous structure after annealing, and the initial dielectric constant layer form a high dielectric constant layer after annealing.

In the above-described preparation method for the capacitor structure, the material of the second amorphous layer may include hafnium silicate with a mass concentration of silicon of 10%-50% or aluminum titanate with a mass concentration of aluminum of 10%-50%, and the second amorphous layer have a thickness of 0.5 nm-5 nm.

In the above-described preparation method for the capacitor structure, the material of the first amorphous layer may include hafnium silicate or aluminum titanate.

In the above-described preparation method for the capacitor structure, the mass concentration of silicon in the hafnium silicate may be 10%-50%, and the mass concentration of aluminum in the aluminum titanate may be 10%-50%.

In the above-described preparation method for the capacitor structure, the first amorphous layer may have a thickness of 0.5 nm-5 nm.

In the above-described preparation method for the capacitor structure, the material of the initial dielectric constant layer may include silicon-doped hafnium oxide, silicon-doped zirconium oxide, or strontium titanate.

In the above-described preparation method for the capacitor structure, the mass concentration of silicon in the silicon-doped hafnium oxide and the mass concentration of silicon in the silicon-doped zirconium oxide may be less than or equal to 10%.

In the above-described preparation method for the capacitor structure, the initial dielectric constant layer may have a thickness of 1-10 nm.

In the above-described preparation method for the capacitor structure, an annealing temperature may be 200° C.-600° C., and an annealing time may be 10 s-600 s.

In the above-described preparation method for the capacitor structure, the first amorphous layer and the second amorphous layer may have a dielectric constant of 20-50, and the high dielectric constant layer may have a dielectric constant of 40-300.

According to a second aspect, the present application provides a capacitor structure, which includes a first electrode, a dielectric layer, and a second electrode. The first electrode and the second electrode may be disposed opposing each other. The dielectric layer may be located between the first electrode and the second electrode and is in contact with the first electrode and the second electrode. The dielectric layer may include a first amorphous layer, a high dielectric constant layer, and a second amorphous layer. The first amorphous layer is in contact with the first electrode. The second amorphous layer is in contact with the second electrode. The high dielectric constant layer is located between the first amorphous layer and the second amorphous layer and is in contact with the first amorphous layer and the second amorphous layer. The first amorphous layer maintains an amorphous structure after annealing. The high dielectric constant layer can be formed by crystallizing an initial dielectric constant layer after annealing.

The capacitor structure provided by the present application includes a first electrode and a second electrode which are disposed opposing each other, and a dielectric layer which is located between the first electrode and the second electrode and is in contact with the first electrode and the second electrode. The dielectric layer includes a first amorphous layer in contact with the first electrode, a second amorphous layer in contact with the second electrode, and a high dielectric constant layer located between the first amorphous layer and the second amorphous layer. The high dielectric constant layer is in contact with the first amorphous layer and the second amorphous layer. The first amorphous layer maintains an amorphous structure after annealing, and electron migration is unlikely to occur in an amorphous structure, thereby the first amorphous layer can inhibit electron transport, the leakage current of the capacitor structure is reduced, and the performance of the capacitor structure is improved. In addition, the high dielectric constant layer is formed by crystallizing an initial dielectric constant layer after annealing, and has a higher dielectric constant, therefore the dielectric properties of the capacitor structure can be improved.

In the above-described capacitor structure, the material of the first amorphous layer may include hafnium silicate with a mass concentration of silicon of 10%-50% or aluminum titanate with a mass concentration of aluminum of 10%-50%. The material of the initial dielectric constant layer may include silicon-doped hafnium oxide, silicon-doped zirconium oxide, or strontium titanate. The material of the second amorphous layer may include silicon oxide, aluminum oxide, hafnium silicate with a mass concentration of silicon of 10%-50%, or aluminum titanate with a mass concentration of aluminum of 10%-50%.

According to a third aspect, the present application provides a memory. The memory may include a transistor and the above-described capacitor structure.

The memory provided by the present application, including the above-described capacitor structure, has the advantages of small leakage current and high dielectric constant. Specific effects are as described above, and detailed descriptions are omitted herein.

In addition to the above-described technical problems to be solved by the embodiments of the present application, the technical features constituting the technical solutions, and the beneficial effects brought by the technical features of the technical solutions, other technical problems to be solved by the preparation method for the capacitor structure, the capacitor structure, and the memory provided by the embodiments of the present application, other technical features contained in the technical solutions, and the beneficial effects brought by the technical features will be explained in further detail in the detailed description.

DETAILED DESCRIPTION

A capacitor structure generally includes two electrodes disposed opposingly, and a dielectric layer located between the two electrodes. The material of the dielectric layer is usually hafnium oxide ($HfO_2$), zirconium oxide ($ZrO_2$), or a perovskite structure material such as calcium titanate ($CaTiO_3$) or barium titanate ($BaTiO_3$). The material usually has a high dielectric constant. As such, the dielectric layer can have a good insulating property. However, a large leakage current is generated when the above-described material is in contact with a metal electrode.

An embodiment of the present application provides a preparation method for a capacitor structure. By forming a dielectric layer with a first amorphous layer is formed, and the first amorphous layer still maintains an amorphous structure after annealing, electron migration is unlikely to occur in the amorphous structure, therefore the first amorphous layer can inhibit electron transport, reduce the leakage current of the capacitor structure, and improve the performance of the capacitor structure.

To make the objects, technical solutions, and advantages of the embodiments of the present application clearer, the technical solutions in the embodiments of the present application will be clearly and completely described below with reference to the drawings in the embodiments of the present application. It will be apparent that the described embodiments are some, but not all, embodiments of the present application. Based on the embodiments in the present application, all other embodiments obtained by those of ordinary skill in the art without involving any inventive effort are within the scope of protection of the present application.

Embodiment 1

Referring to FIGS. 1 to 6, FIG. 1 is a flowchart of a preparation method for a capacitor structure according to an embodiment of the present application. FIGS. 2 to 6 are schematic structure diagrams of a capacitor structure at various stages of a preparation process. A preparation method for a capacitor structure is described below with reference to FIGS. 1 to 6. The preparation method may include the following steps.

In step S101, a dielectric layer is formed on a first electrode. The dielectric layer includes a first amorphous layer and a high dielectric constant layer. The first amorphous layer maintains an amorphous structure after annealing. The high dielectric constant layer is formed by crystallizing an initial dielectric constant layer after annealing.

Figure 1:
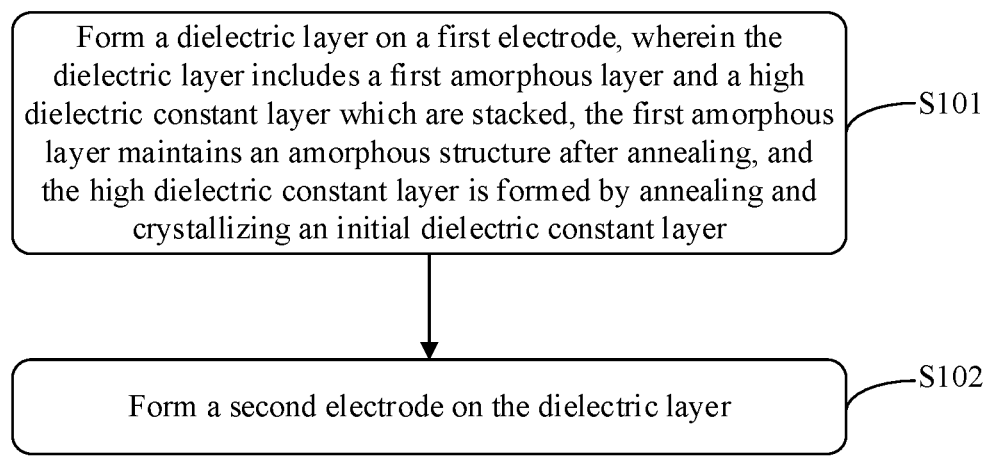
FIG. 1 is a flowchart of a preparation method for a capacitor structure according to an embodiment of the present application.
Figure 2:
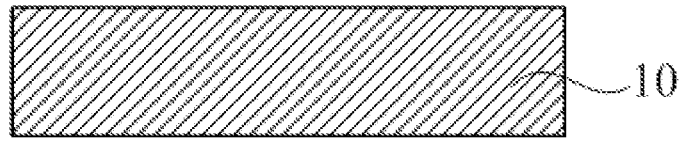
FIG. 2 is a schematic structure diagram of a first electrode according to an embodiment of the present application.

Referring to FIG. 2, a first electrode 10 is provided. The first electrode 10 may be one or more of a metal electrode, a metal oxide electrode, a metal nitride electrode, or a metal silicide electrode. Exemplarily, the material of the first electrode 10 may be one or more of aluminum (Al), copper (Cu), silver (Ag), gold (Au), molybdenum (Mo), nickel (Ni), cobalt (Co), titanium (Ti), or tungsten (W), or one or more of oxide, nitride, or silicide thereof.

The first electrode 10 may be formed by a deposition process. For example, the first electrode 10 may be formed by a Chemical Vapor Deposition (CVD) process, a Physical Vapor Deposition (PVD) process, or an Atomic Layer Deposition (ALD) process, etc. The embodiment of the present application is, certainly, not limited thereto. The first electrode 10 in the embodiment of the present application may be formed by other processes, such as an electroplating process.

After the first electrode 10 is provided, a dielectric layer is formed on the first electrode 10. The dielectric layer in the embodiment of the present application may be a multi-layer structure. For example, the dielectric layer includes a first amorphous layer 20 and a high dielectric constant layer 30 which are stacked. Exemplarily, the first amorphous layer 20 may be located on a side of the high dielectric constant layer 30 adjacent to the first electrode 10. The first amorphous layer 20 may also be located on a side of the high dielectric constant layer 30 distal from the first electrode 10, and the embodiment of the present application is not limited thereto.

The material of the first amorphous layer 20 may be an amorphous structure material (amorphous material) and may maintain an amorphous structure after annealing with no or less crystallization. That is, no or less crystalline phase transition occurs in the first amorphous layer 20 at a higher temperature (200° C.-600° C.). By such an arrangement, atoms or molecules in the amorphous structure material are in a disordered arrangement state, electrons are unlikely to migrate in the amorphous structure material, therefore electron transport can still be inhibited after the first amorphous layer 20 is annealed, the leakage current of the capacitor structure is reduced, and the performance of the capacitor structure is improved.

Exemplarily, the material of the first amorphous layer 20 includes hafnium silicate or aluminum titanate. The mass concentration of silicon in the hafnium silicate may be 10%-50%, and the mass concentration of aluminum in the aluminum titanate may be 10%-50%. The first amorphous layer 20 may have a thickness of 0.5 nm-5 nm to prevent the first amorphous layer 20 from being too thick and affecting the overall dielectric properties of the capacitor structure. In the embodiment of the present application, the first amorphous layer 20 may have a dielectric constant of 20-50.

The high dielectric constant layer 30 may have a higher dielectric constant, e.g., a value of 40-300, to increase the overall dielectric constant of the capacitor structure so that the capacitor structure has better dielectric properties. In the embodiment of the present application, the high dielectric constant layer 30 may be formed by crystallization when the initial dielectric constant layer 31 is annealed, that is, the high dielectric constant layer 30 has a relatively high degree of crystallization.

In the embodiment of the present application, the dielectric layer may be formed on the first electrode 10 by using the following steps.

Figure 3:
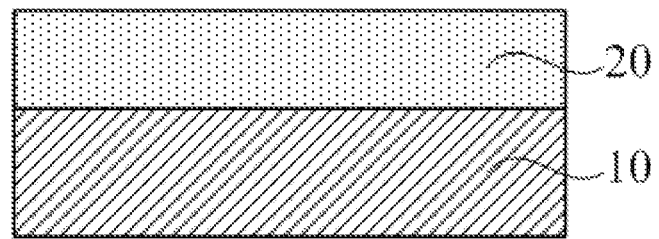
FIG. 3 is a schematic structure diagram after a first amorphous layer is formed according to an embodiment of the present application.

Firstly, a first amorphous layer 20 is formed on the first electrode 10. Referring to FIG. 3, a first amorphous layer 20 may be formed on the first electrode 10 by a deposition process, e.g., formed on the first electrode 10 by Plasma Enhanced Chemical Vapor Deposition (PECVD). The first amorphous layer 20 can, certainly, also be formed on the first electrode 10 by using a sputtering process, etc., and the embodiment of the present application is not limited thereto.

Figure 4:
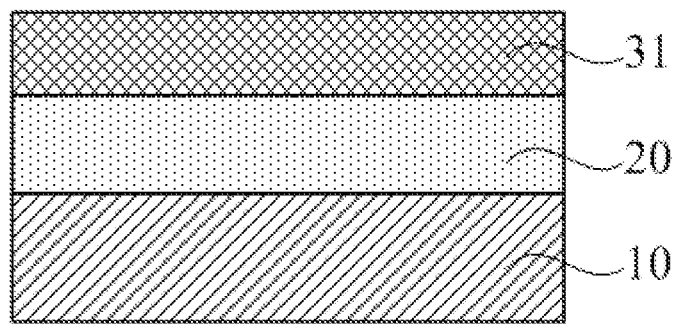
FIG. 4 is a schematic structure diagram after an initial dielectric constant layer is formed according to an embodiment of the present application.

Secondly, an initial dielectric constant layer 31 is formed on the first amorphous layer 20. Referring to FIG. 4, an initial dielectric constant layer 31 is deposited on the first amorphous layer 20. The initial dielectric constant layer 31 may have a thickness of 1-10 nm.

The material of the initial dielectric constant layer 31 may be silicon-doped hafnium oxide, silicon-doped zirconium oxide, or strontium titanate ($SrTiO_3$). The mass concentration of silicon in the hafnium oxide may be less than or equal to 10%, and the mass concentration of silicon in the zirconium oxide may be less than or equal to 10%. By such an arrangement, the initial dielectric constant layer 31 may undergo a crystalline phase transition at a higher temperature of, e.g., 200° C.-600° C. Exemplarily, the transition from a low dielectric constant crystalline phase (e.g., monoclinic or orthorhombic systems, etc.) to a high dielectric constant crystalline phase (e.g., tetragonal or cubic systems, etc.), the transformed crystalline phase has a higher dielectric constant, and the dielectric constant of the capacitor structure is increased.

Figure 5:
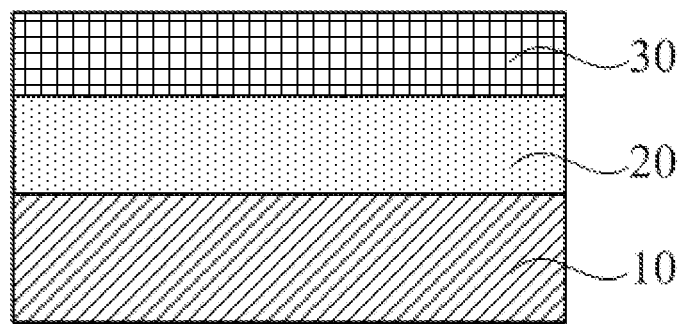
FIG. 5 is a schematic structure diagram after a first amorphous layer and an initial dielectric constant layer are annealed according to an embodiment of the present application.

Then, the first amorphous layer 20 and the initial dielectric constant layer 31 are annealed. Referring to FIG. 5, the first amorphous layer 20 maintains an amorphous structure after annealing. The initial dielectric constant layer 31 is annealed and crystallized to form a high dielectric constant layer 30 with a higher dielectric constant. Exemplarily, an annealing temperature may be 200-600° C., and an annealing time may be 10-600 s. The first amorphous layer 20 and the high dielectric constant layer 30 form a dielectric layer.

In step S102, a second electrode is formed on the dielectric layer.

Figure 6:
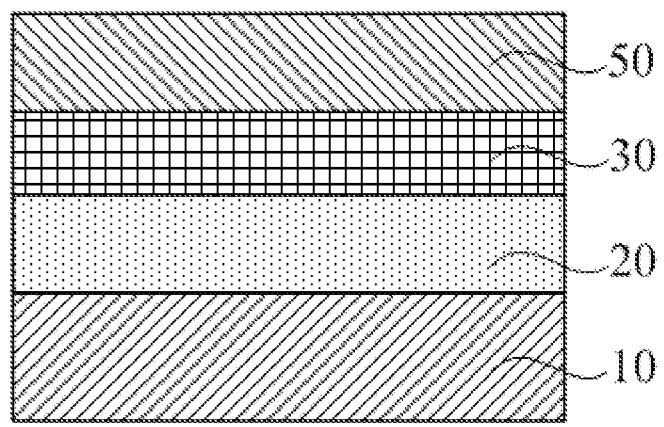
FIG. 6 is a schematic structure diagram after a second electrode is formed on a high dielectric constant layer according to an embodiment of the present application.

Referring to FIG. 6, a second electrode 50 is formed on the dielectric layer. Exemplarily, the second electrode 50 is deposited and formed on the high dielectric constant layer 30 in the dielectric layer. The second electrode 50 may be one or more of a metal electrode, a metal oxide electrode, a metal nitride electrode, or a metal silicide electrode. The material and preparation of the second electrode may be referred to the first electrode 10, and detailed descriptions are omitted herein. The material of the second electrode 50 and the material of the first electrode 10 may be the same or different. As shown in FIG. 6, the first electrode 10, the first amorphous layer 20, the high dielectric constant layer 30, and the second electrode 50 are sequentially stacked from bottom to top to form the capacitor structure in the embodiment of the present application.

In the preparation method for the capacitor structure provided by the embodiment of the present application, a dielectric layer is first formed on a first electrode 10. The dielectric layer includes a first amorphous layer 20 and a high dielectric constant layer 30 which are stacked. The first amorphous layer 20 maintains an amorphous structure after annealing. The high dielectric constant layer 30 is formed by annealing and crystallizing an initial dielectric constant layer 31. A second electrode 50 is then formed on the dielectric layer. Since the first amorphous layer 20 still has the amorphous structure after annealing, electron migration is unlikely to occur in the amorphous structure, therefore the first amorphous layer 20 can inhibit electron transport, the leakage current of the capacitor structure is reduced, and the performance of the capacitor structure is improved. In addition, the high dielectric constant layer 30 may have a higher dielectric constant, and the dielectric constant of the capacitor structure can be increased, therefore the capacitor structure has better dielectric properties.

Figure 7:
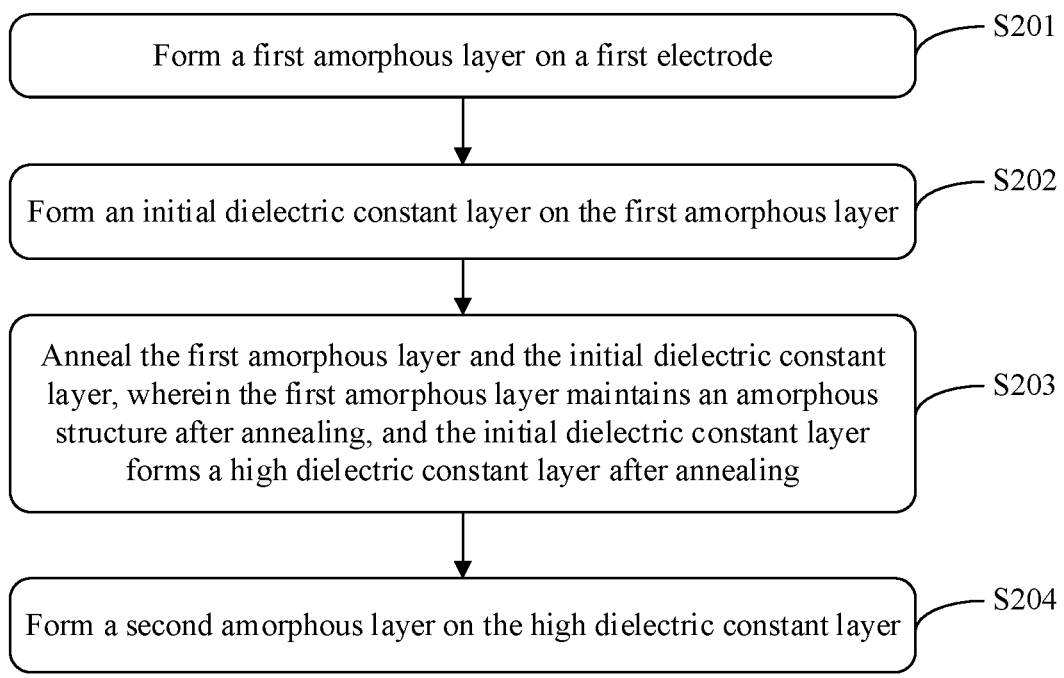
FIG. 7 is a flowchart of a preparation method for a dielectric layer according to an embodiment of the present application.

It should be noted that referring to FIG. 7, in the embodiment of the present application, the dielectric layer can also be formed on the first electrode by using the following steps.

In step S201, a first amorphous layer is formed on the first electrode. The first amorphous layer may be formed on the first electrode by a deposition process. The material of the first amorphous layer may include hafnium silicate with a mass concentration of silicon of 10%-50% or aluminum titanate having an mass concentration of aluminum of 10%-50%.

In step S202, an initial dielectric constant layer is formed on the first amorphous layer. For example, the initial dielectric constant layer is deposited on the first amorphous layer. The material of the initial dielectric constant layer may include silicon-doped hafnium oxide, silicon-doped zirconium oxide, or strontium titanate. The mass concentration of silicon in the hafnium oxide may be less than or equal to 10%, and the mass concentration of silicon in the zirconium oxide may be less than or equal to 10%. The initial dielectric constant layer 31 may have a thickness of 1-10 nm.

In step S203, the first amorphous layer and the initial dielectric constant layer are annealed. The first amorphous layer maintains an amorphous structure after annealing, and the initial dielectric constant layer forms a high dielectric constant layer after annealing. That is, the initial dielectric constant layer 31 is annealed and crystallized to form a high dielectric constant layer 30 having a higher dielectric constant, and the dielectric constant of the capacitor structure is increased. The first amorphous layer 20 maintains the amorphous structure after annealing, thereby inhibiting electron transport and reducing the leakage current of the capacitor structure. An annealing temperature may be 200-600° C., and an annealing time may be 10-600 s.

Figure 8:
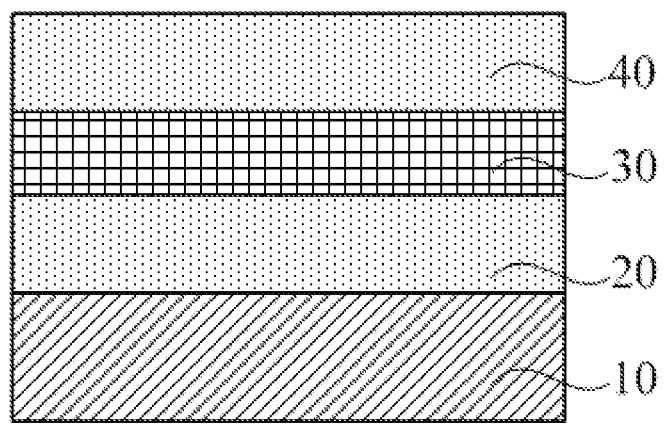
FIG. 8 is a schematic structure diagram after a second amorphous layer is formed on a high dielectric constant layer according to an embodiment of the present application.

In step S204, a second amorphous layer is formed on the high dielectric constant layer. Referring to FIG. 8, the second amorphous layer 40 may have a thickness of 0.5-5 nm and a dielectric constant of 20-50. The material of the second amorphous layer 40 may be an amorphous material.

Exemplarily, the material of the second amorphous layer 40 may include silicon oxide ($SiO_2$) and aluminum oxide ($Al_2O_3$), and may also include an amorphous material such as hafnium silicate with a mass concentration of silicon of 10%-50% or aluminum titanate with an mass concentration of aluminum of 10%-50%.

The second amorphous layer 40 in the embodiment of the present application does not need to be annealed, and therefore it is not limited whether a crystalline phase transition occurs when the second amorphous layer 40 is annealed. The first amorphous layer 20, the high dielectric constant layer 30, and the second amorphous layer 40 form the dielectric layer in the embodiment of the present application.

Figure 10:
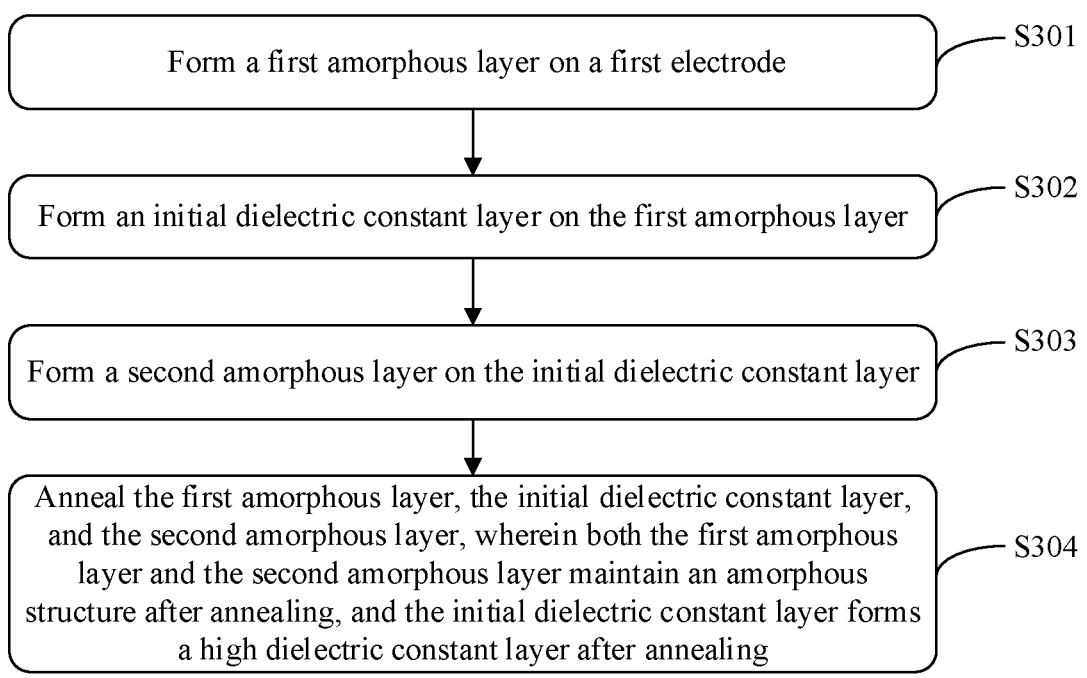
FIG. 10 is a flowchart of another preparation method for a dielectric layer according to an embodiment of the present application.

It should be noted that in the embodiment of the present application, referring to FIG. 10, the dielectric layer may also be formed on the first electrode by using the following steps.

In step S301, a first amorphous layer is formed on the first electrode. The first amorphous layer may be formed on the first electrode by a deposition process. The material of the first amorphous layer may include hafnium silicate with a mass concentration of silicon of 10%-50% or aluminum titanate with an mass concentration of aluminum of 10%-50%.

In step S302, an initial dielectric constant layer is formed on the first amorphous layer. For example, the initial dielectric constant layer may be formed on the first amorphous layer by a deposition process. The material of the initial dielectric constant layer may include silicon-doped hafnium oxide, silicon-doped zirconium oxide, or strontium titanate. The mass concentration of silicon in the hafnium oxide may be less than or equal to 10%, and the mass concentration of silicon in the zirconium oxide may be less than or equal to 10%. The initial dielectric constant layer 31 may have a thickness of 1-10 nm.

Figure 11:
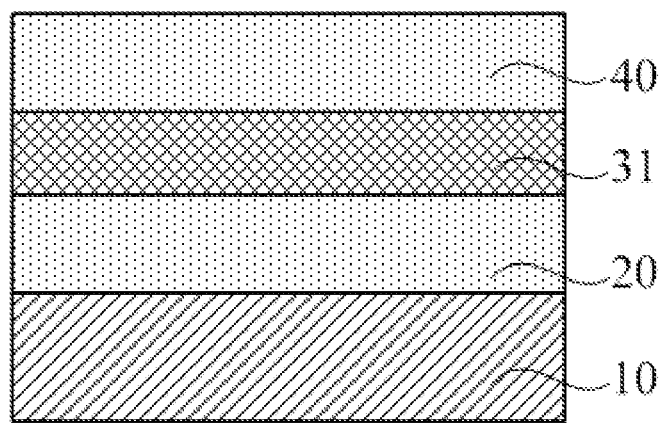
FIG. 11 is a schematic structure diagram after a second amorphous layer is formed on an initial dielectric constant layer according to an embodiment of the present application.

In step S303, a second amorphous layer is formed on the initial dielectric constant layer. Referring to FIG. 11, the second amorphous layer 40 may have a thickness of 0.5-5 nm and a dielectric constant of 20-50. The material of the second amorphous layer 40 may be an amorphous material.

Exemplarily, the material of the second amorphous layer 40 may include an amorphous material with no or less crystallization during annealing such as hafnium silicate having a silicon mass concentration of 10%-50% or aluminum titanate having an aluminum mass concentration of 10%-50%. By such an arrangement, the second amorphous layer 40 may maintain the amorphous structure with no or less crystallization during subsequent annealing, so that the second amorphous layer 40 can also inhibit electron transport and further reduce the leakage current of the capacitor structure.

In step S304, the first amorphous layer, the initial dielectric constant layer, and the second amorphous layer are annealed. Both the first amorphous layer and the second amorphous layer maintain an amorphous structure after annealing, and the initial dielectric constant layer forms a high dielectric constant layer after annealing. Exemplarily, an annealing temperature may be 200-600° C., and an annealing time may be 10-600 s.

Figure 12:
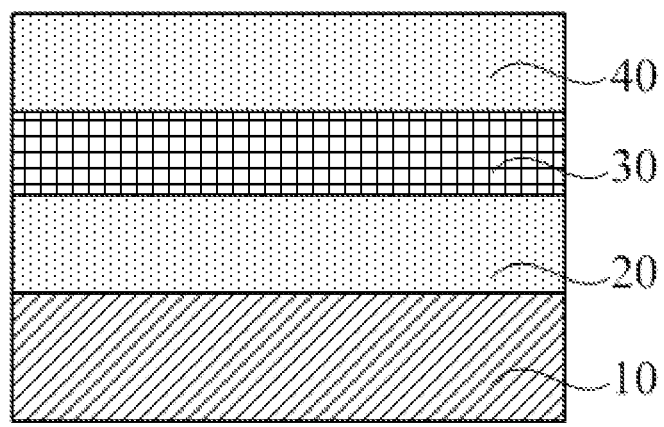
FIG. 12 is a schematic structure diagram after a first amorphous layer, an initial dielectric constant layer, and a second amorphous layer are annealed according to an embodiment of the present application.

In the present step, referring to FIG. 12, the initial dielectric constant layer 31 is annealed and crystallized to form a high dielectric constant layer 30 with a relatively high dielectric constant, and the dielectric constant of the capacitor structure is increased. The first amorphous layer 20 maintains the amorphous structure after annealing, so that electron transport can be inhibited, and the leakage current of the capacitor structure can be reduced. The second amorphous layer 40 maintains the amorphous structure after annealing, so that electron transport can be inhibited, thereby further reducing the leakage current of the capacitor structure. The first amorphous layer 20, the high dielectric constant layer 30, and the second amorphous layer 40 form the dielectric layer in the embodiment of the present application.

It should be noted that the preparation method for the capacitor structure in the embodiment of the present application may be applicable to a columnar capacitor structure. Exemplarily, in the columnar capacitor structure shown in FIG. 13, the first electrode 10 is roughly U-shaped, and both the inside and the outside of the U-shape are provided with a dielectric layer and a second electrode 50 to form a stacked double-sided columnar capacitor structure.

Figure 13:
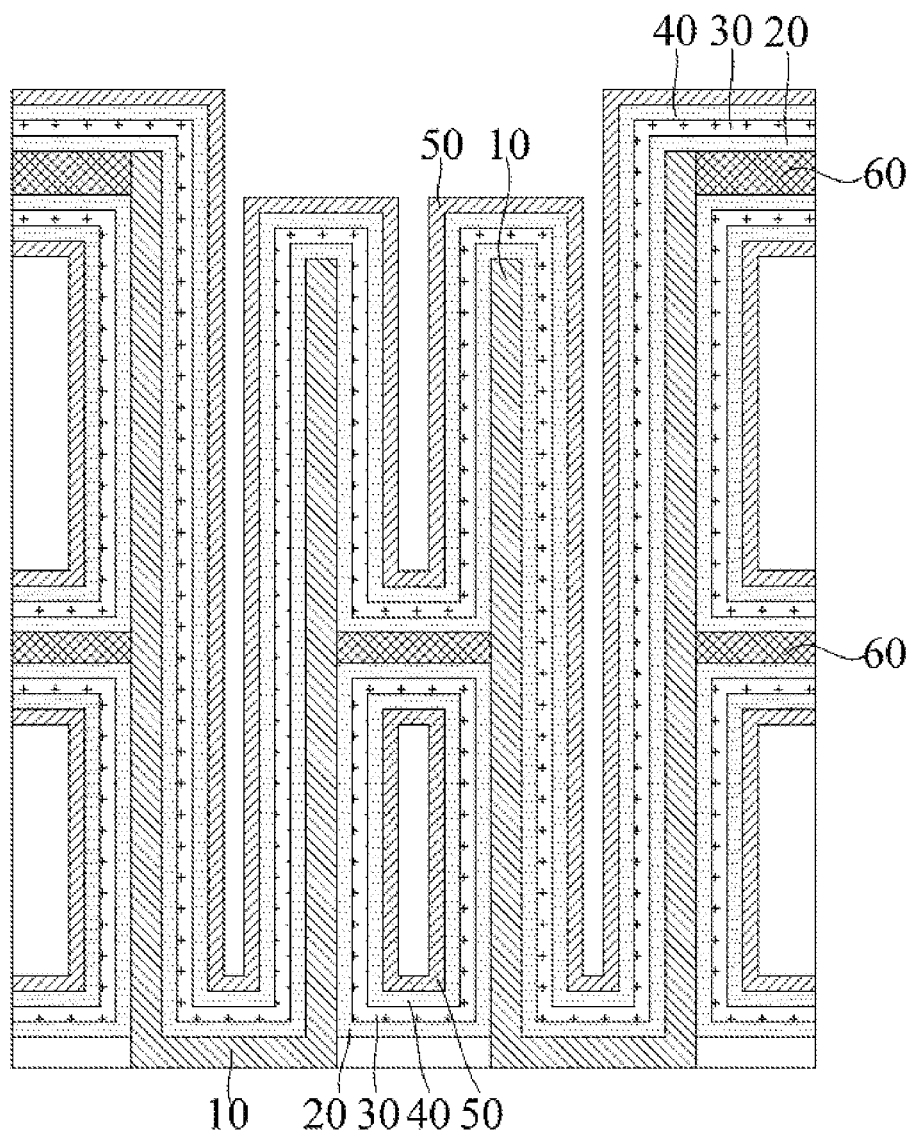
FIG. 13 is a schematic diagram of a capacitor structure according to an embodiment of the present application.

Referring to FIG. 13, the dielectric layer includes a first amorphous layer 20, a high dielectric constant layer 30, and a second amorphous layer 40 in a direction from the first electrode 10 to the second electrode 50. The first amorphous layer 20 maintains the amorphous structure after annealing, so as to inhibit electron transport, reduce the leakage current of the capacitor structure, and improve the performance of the capacitor structure. In the columnar capacitance structure shown in FIG. 13, the first electrode 10 is formed on a support pad 60. The support pad 60 may be formed at the middle and top of a capacitor to ensure that the capacitor is stably supported.

Embodiment 2

Figure 9:
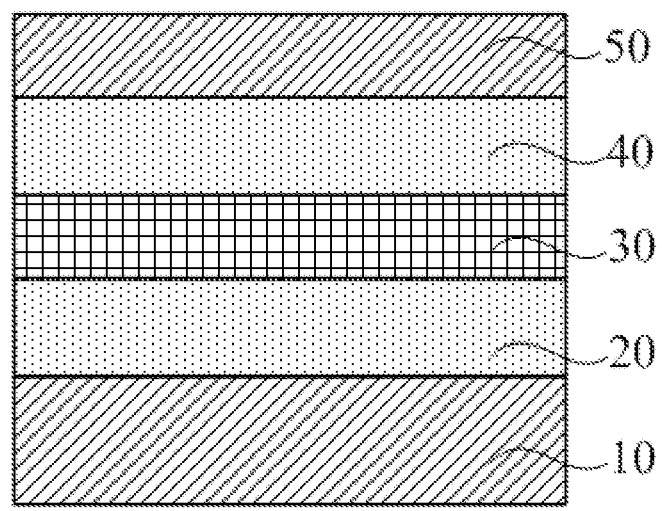
FIG. 9 is a schematic structure diagram after a second electrode is formed on a second amorphous layer according to an embodiment of the present application.

Referring to FIG. 9, an embodiment of the present application provides a capacitor structure including a first electrode 10, a dielectric layer, and a second electrode 50. The first electrode 10 and the second electrode 50 are disposed opposingly. The dielectric layer is disposed between the first electrode 10 and the second electrode 50, and is in contact with the first electrode 10 and the second electrode 50.

The first electrode 10 and the second electrode 50 may be one or more of a metal electrode, a metal oxide electrode, a metal nitride electrode, or a metal silicide electrode. That is, the capacitor structure in the embodiment of the present application may be a Metal-Insulator-Metal (MIM) capacitor structure, and the embodiment of the present application is, certainly, not limited thereto. For example, the capacitor structure in the embodiment of the present application may also be a Metal-Insulator-Semiconductor (MIS) capacitor, etc.

The dielectric layer includes a first amorphous layer 20, a high dielectric constant layer 30, and a second amorphous layer 40. The first amorphous layer 20 is in contact with the first electrode 10. The second amorphous layer 40 is in contact with the second electrode 50. The high dielectric constant layer 30 is located between the first amorphous layer 20 and the second amorphous layer 40 and is in contact with the first amorphous layer 20 and the second amorphous layer 40. Exemplarily, as shown in FIG. 9, the first electrode 10, the first amorphous layer 20, the high dielectric constant layer 30, the second amorphous layer 40, and the second electrode 50 are sequentially stacked from bottom to top.

The first amorphous layer 20 is annealed with no or less crystalline phase transition and may still maintain an amorphous structure. Compared with a crystal structure, electron migration is unlikely to occur in the amorphous structure, so that the first amorphous layer 20 can inhibit electron transport and reduce the leakage current of the capacitor structure.

The material of the first amorphous layer 20 may be an amorphous structure material such as hafnium silicate or aluminum titanate. The concentration of silicon in the hafnium silicate is 10%-50%, and the concentration of aluminum in the aluminum titanate is 10%-50%. The first amorphous layer may have a dielectric constant of 20-50 and a thickness of 0.5-5 nm.

The high dielectric constant layer 30 is formed by annealing and crystallizing an initial dielectric constant layer 31, that is, the crystal phase of the initial dielectric constant layer 31 is changed after annealing from a low dielectric constant crystal phase to a high dielectric constant crystal phase, so that the high dielectric constant layer 30 having a higher dielectric constant is formed, and the dielectric constant of the capacitor structure is increased. The high dielectric constant layer 30 may have a dielectric constant of 40-300 and a thickness of 1-10 nm. An annealing temperature may be 200° C.-600° C., and an annealing time may be 10-600 s.

The material of the initial dielectric constant layer 31 may be silicon-doped hafnium oxide, silicon-doped zirconium oxide, or strontium titanate. The mass concentration of silicon in the hafnium oxide is less than or equal to 10%, and the mass concentration of silicon in the zirconium oxide is less than or equal to 10%.

The material of the second amorphous layer 40 may be an amorphous structure material. Exemplarily, the material of the second amorphous layer 40 may include silicon oxide, aluminum oxide, or an amorphous material such as hafnium silicate or aluminum titanate. The concentration of silicon in the hafnium silicate is 10%-50%, and the concentration of aluminum in the aluminum titanate is 10%-50%. The second amorphous layer may have a dielectric constant of 20-50 and a thickness of 0.5-5 nm.

It should be noted that when the second amorphous layer 40 needs to be annealed, the material of the second amorphous layer 40 may be an amorphous material with no or less crystallization during annealing, such as hafnium silicate or aluminum titanate, so that the annealed second amorphous layer 40 can still maintain an amorphous structure to inhibit electron transport and reduce the leakage current of the capacitor structure. When the second amorphous layer 40 does not need to be annealed, it is not necessary to limit whether crystallization occurs after the second amorphous layer 40 is annealed, and the material of the second amorphous layer 40 is an amorphous structure material.

It should be noted that the capacitor structure in the embodiment of the present application may be applicable to a columnar capacitor structure. Exemplarily, in the columnar capacitor structure shown in FIG. 13, the first electrode 10 is roughly U-shaped, and both the inside and the outside of the U shape are provided with a dielectric layer and a second electrode 50 to form a stacked double-sided columnar capacitor structure.

Referring to FIG. 13, the dielectric layer includes a first amorphous layer 20, a high dielectric constant layer 30, and a second amorphous layer 40 in a direction from the first electrode 10 to the second electrode 50. The first amorphous layer 20 maintains the amorphous structure after annealing, so as to inhibit electron transport, reduce the leakage current of the capacitor structure, and improve the performance of the capacitor structure. In the columnar capacitance structure shown in FIG. 13, the first electrode 10 is formed on a support pad 60. The support pad 60 can be formed at the middle and top of a capacitor to ensure that the capacitor is stably supported.

The capacitor structure in the embodiment of the present application includes a first electrode 10 and a second electrode 50 which are disposed opposing each other, and a dielectric layer which is located between the first electrode 10 and the second electrode 50 and is in contact with the first electrode 10 and the second electrode 50. The dielectric layer includes a first amorphous layer 20 in contact with the first electrode 10, a second amorphous layer 40 in contact with the second electrode 50, and a high dielectric constant layer 30 located between the first amorphous layer 20 and the second amorphous layer 40. The high dielectric constant layer 30 is in contact with the first amorphous layer 20 and the second amorphous layer 40. The first amorphous layer 20 maintains an amorphous structure after annealing, and electron migration is unlikely to occur in the amorphous structure, therefore the leakage current of the capacitor structure is reduced, and the performance of the capacitor structure is improved. In addition, the high dielectric constant layer 30 is formed by annealing and crystallizing an initial dielectric constant layer 31, and has a higher dielectric constant, therefore the dielectric properties of the capacitor structure can be improved.

Embodiment 3

An embodiment of the present application also provides a memory which includes a transistor and a capacitor structure. The capacitor structure stores data information, and the transistor controls reading and writing of the data information in the capacitor structure. A gate of the transistor is electrically connected to a Word Line (WL) structure of the memory, one of a source and a drain of the transistor is electrically connected to a Bit Line (BL) structure, and the other of the source and the drain is electrically connected to the capacitor structure.

The capacitor structure includes a first electrode, a dielectric layer, and a second electrode. The first electrode and the second electrode are disposed opposing each other. The dielectric layer is located between the first electrode and the second electrode and is in contact with the first electrode and the second electrode. The dielectric layer includes a first amorphous layer, a high dielectric constant layer, and a second amorphous layer which are stacked. The first amorphous layer may be located on a side of the dielectric layer adjacent to the first electrode.

The first electrode and the second electrode may be one or more of a metal electrode, a metal oxide electrode, a metal nitride electrode, or a metal silicide electrode. The materials of the first amorphous layer and the second amorphous layer may be an amorphous structure material, which may have a dielectric constant of 20-50 and a thickness of 0.5-5 nm. The first amorphous layer may still maintain an amorphous structure after annealing. The high dielectric constant layer may have a dielectric constant of 40-300 and a thickness of 1-10 nm, and is formed by annealing and crystallizing an initial dielectric constant layer.

Exemplarily, the material of the first amorphous layer includes hafnium silicate with a mass concentration of silicon of 10%-50% or aluminum titanate having an mass concentration of aluminum of 10%-50%. The material of the initial dielectric constant layer includes silicon-doped hafnium oxide, silicon-doped zirconium oxide, or strontium titanate. The material of the second amorphous layer includes silicon oxide, aluminum oxide, hafnium silicate having a mass concentration of silicon of 10%-50%, or aluminum titanate with a mass concentration of aluminum of 10%-50%.

The memory in the embodiment of the present application includes a transistor and a capacitor structure. The memory, having the capacitor structure in the above-described embodiment, has the advantage of small leakage current. Specific effects are referred to the above-described embodiment, and detailed descriptions are omitted herein.

The embodiments or implementations described in this specification are described in an incremental manner, with each embodiment being described with emphasis on differences from the other embodiments, and with reference to like parts throughout the various embodiments.

Those skilled in the art will appreciate that in the disclosure of the present application, orientation or positional relationships indicated by the terms "longitudinal", "transverse", "upper", "lower", "front", "rear", "left", "right", "vertical", "horizontal", "top", "bottom", "inner", "outer", etc. are based on the orientation or positional relationships shown in the drawings, which are merely intended to facilitate describing the present application and to simplify the description rather than indicating or implying that the referenced system or element must have a particular orientation and be constructed and operated in a particular orientation. Therefore, the above terms are not to be construed as limiting the present application.

In the descriptions of this specification, the description with reference to the terms "one implementation", "some implementations", "schematic implementations", "example", "specific example", or "some examples", etc. means that particular features, structures, materials, or characteristics described in conjunction with the implementation or example are included in at least one implementation or example of the present application. In this specification, schematic representations of the above terms do not necessarily refer to the same implementation or example. Furthermore, the particular features, structures, materials, or characteristics described may be combined in any suitable manner in any one or more implementations or examples.

Finally, it should be noted that the above embodiments are merely illustrative of the technical solutions of the present application and are not intended to be limiting thereof. Although the present application has been described in detail with reference to the foregoing embodiments, those of ordinary skill in the art will appreciate that the technical solutions of the foregoing embodiments may still be modified, or some or all of the technical features thereof may be equivalently replaced. These modifications or replacements do not make the essence of the corresponding technical solutions depart from the scope of the technical solutions of the various embodiments of the present application.

What is claimed is:

1. A preparation method for a capacitor structure, comprising:
    forming a dielectric layer on a first electrode,
        wherein the dielectric layer comprises a first amorphous layer and a high dielectric constant layer and a second amorphous layer arranged in a stack, the first amorphous layer has an amorphous structure, and the high dielectric constant layer is formed by crystallizing an initial dielectric constant layer after annealing; and
    forming a second electrode on the dielectric layer;
        wherein the high dielectric constant layer has a dielectric constant of 40-300;
    wherein the material of the first amorphous layer comprises aluminum titanate, and a mass concentration of aluminum in the aluminum titanate is 10%-50%; and
    the first amorphous layer has a thickness of 0.5-5 nm.

2. The preparation method for the capacitor structure of claim 1, wherein the step of forming a dielectric layer on a first electrode comprises:
    forming the first amorphous layer on the first electrode;

forming the initial dielectric constant layer on the first amorphous layer;
annealing the first amorphous layer and the initial dielectric constant layer, wherein the first amorphous layer maintains an amorphous structure after annealing, and the initial dielectric constant layer forms the high dielectric constant layer after annealing; and
forming the second amorphous layer on the high dielectric constant layer.

3. The preparation method for the capacitor structure of claim 2, wherein a material of the second amorphous layer comprises silicon oxide, aluminum oxide, hafnium silicate with a mass concentration of silicon of 10-50%, or aluminum titanate with a mass concentration of aluminum of 10-50%, and the second amorphous layer has a thickness of 0.5-5 nm.

4. The preparation method for the capacitor structure of claim 1, wherein the step of forming a dielectric layer on a first electrode comprises:
forming the first amorphous layer on the first electrode;
forming the initial dielectric constant layer on the first amorphous layer;
forming the second amorphous layer on the initial dielectric constant layer; and
annealing the first amorphous layer, the initial dielectric constant layer, and the second amorphous layer, wherein both the first amorphous layer and the second amorphous layer maintain an amorphous structure after annealing, and the initial dielectric constant layer forms the high dielectric constant layer after annealing.

5. The preparation method for the capacitor structure of claim 4, wherein a material of the second amorphous layer comprises hafnium silicate having a mass concentration of silicon of 10-50% or aluminum titanate with a mass concentration of aluminum of 10-50%, and the second amorphous layer has a thickness of 0.5-5 nm.

6. The preparation method for the capacitor structure of claim 1, wherein a material of the initial dielectric constant layer comprises silicon-doped hafnium oxide, silicon-doped zirconium oxide, or strontium titanate.

7. The preparation method for the capacitor structure of claim 2, wherein a material of the initial dielectric constant layer comprises silicon-doped hafnium oxide, silicon-doped zirconium oxide, or strontium titanate.

8. The preparation method for the capacitor structure of claim 3, wherein a material of the initial dielectric constant layer comprises silicon-doped hafnium oxide, silicon-doped zirconium oxide, or strontium titanate.

9. The preparation method for the capacitor structure of claim 4, wherein a material of the initial dielectric constant layer comprises silicon-doped hafnium oxide, silicon-doped zirconium oxide, or strontium titanate.

10. The preparation method for the capacitor structure of claim 5, wherein a material of the initial dielectric constant layer comprises silicon-doped hafnium oxide, silicon-doped zirconium oxide, or strontium titanate.

11. The preparation method for the capacitor structure of claim 6, wherein both a mass concentration of silicon in the silicon-doped hafnium oxide and a mass concentration of silicon in the silicon-doped zirconium oxide are less than or equal to 10%.

12. The preparation method for the capacitor structure of claim 1, wherein the initial dielectric constant layer has a thickness of 1 nm-10 nm.

13. The preparation method for the capacitor structure of claim 4, wherein an annealing temperature is 200° C.-600° C., and an annealing time is 10 s-600 s.

14. The preparation method for the capacitor structure of claim 2, wherein the first amorphous layer and the second amorphous layer have a dielectric constant of 20-50.

15. A capacitor structure, comprising:
a first electrode, a dielectric layer, and a second electrode, wherein
the first electrode and the second electrode are disposed opposing each other, and the dielectric layer is located between the first electrode and the second electrode and is in contact with the first electrode and the second electrode;
the dielectric layer comprises a first amorphous layer, a high dielectric constant layer, and a second amorphous layer arranged in a stack;
the first amorphous layer is in contact with the first electrode, the second amorphous layer is in contact with the second electrode, and the high dielectric constant layer is located between the first amorphous layer and the second amorphous layer and is in contact with the first amorphous layer and the second amorphous layer; and
the first amorphous layer has an amorphous structure, and the high dielectric constant layer is formed by crystallizing an initial dielectric constant layer after annealing; and
wherein the high dielectric constant layer has a dielectric constant of 40-300;
wherein the material of the first amorphous layer comprises aluminum titanate, and a mass concentration of aluminum in the aluminum titanate is 10%-50%; and
the first amorphous layer has a thickness of 0.5-5 nm.

16. The capacitor structure of claim 15, wherein
a material of the initial dielectric constant layer comprises silicon-doped hafnium oxide, silicon-doped zirconium oxide, or strontium titanate; and
a material of the second amorphous layer comprises silicon oxide, aluminum oxide, hafnium silicate with a mass concentration of silicon of 10%-50%, or aluminum titanate with a mass concentration of aluminum of 10%-50%.

17. A memory device, comprising:
a transistor; and
a capacitor structure comprising:
a first electrode, a dielectric layer, and a second electrode, wherein
the first electrode and the second electrode are disposed opposing each other, and the dielectric layer is located between the first electrode and the second electrode and is in contact with the first electrode and the second electrode;
the dielectric layer comprises a first amorphous layer, a high dielectric constant layer, and a second amorphous layer arranged in a stack;
the first amorphous layer is in contact with the first electrode, the second amorphous layer is in contact with the second electrode, and the high dielectric constant layer is located between the first amorphous layer and the second amorphous layer and is in contact with the first amorphous layer and the second amorphous layer; and
the first amorphous layer has an amorphous structure, and the high dielectric constant layer is formed by crystallizing an initial dielectric constant layer after annealing; and
wherein the high dielectric constant layer has a dielectric constant of 40-300;

wherein the material of the first amorphous layer comprises aluminum titanate, and a mass concentration of aluminum in the aluminum titanate is 10%-50%; and the first amorphous layer has a thickness of 0.5-5 nm.

* * * * *